US010566954B2

(12) United States Patent
Ichihashi

(10) Patent No.: US 10,566,954 B2
(45) Date of Patent: Feb. 18, 2020

(54) VARIABLE CAPACITANCE CIRCUIT, OSCILLATOR CIRCUIT, AND METHOD OF CONTROLLING VARIABLE CAPACITANCE CIRCUIT

(71) Applicant: SONY CORPORATION, Tokyo (JP)

(72) Inventor: Masahiro Ichihashi, Fukuoka (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/067,250

(22) PCT Filed: Dec. 6, 2016

(86) PCT No.: PCT/JP2016/086142
§ 371 (c)(1),
(2) Date: Jun. 29, 2018

(87) PCT Pub. No.: WO2017/126241
PCT Pub. Date: Jul. 27, 2017

(65) Prior Publication Data
US 2019/0020330 A1    Jan. 17, 2019

(30) Foreign Application Priority Data

Jan. 21, 2016 (JP) ................................. 2016-009328

(51) Int. Cl.
*H03H 11/48* (2006.01)
*H03H 11/04* (2006.01)
(Continued)

(52) U.S. Cl.
CPC ............. *H03H 11/481* (2013.01); *H03B 5/08* (2013.01); *H03B 5/1206* (2013.01);
(Continued)

(58) Field of Classification Search
CPC .... H03H 11/04; H03H 11/481; H03B 5/1206; H03B 5/1228; H03B 5/1215;
(Continued)

(56) References Cited

U.S. PATENT DOCUMENTS

2003/0184378 A1* 10/2003 Segawa ................ H03D 7/1441
330/254
2005/0046502 A1* 3/2005 Singh ..................... H03K 3/354
331/132
(Continued)

FOREIGN PATENT DOCUMENTS

CN       102377430 A    3/2012
EP        1119908 A1    8/2001
(Continued)

OTHER PUBLICATIONS

International Search Report and Written Opinion of PCT Application No. PCT/JP2016/086142, dated Feb. 21, 2017, 08 pages of ISRWO.

*Primary Examiner* — Arnold M Kinkead
(74) *Attorney, Agent, or Firm* — Chip Law Group

(57) ABSTRACT

A capacitor bank has a capacitance value that is discontinuous and has an extremely narrow variable range. Thus, in a case of obtaining a wide variable range of the capacitance value, a large number of capacitors are connected in parallel and used while being switched by switches. The present technology achieves at least one of: allowing the capacitance value of a variable capacitance circuit to be varied continuously by electrical control without increasing the parasitic capacitance; and decreasing the current consumption of an oscillator circuit using the variable capacitance circuit as compared to a conventional case. The variable capacitance circuit includes: a transconductance circuit that includes a MOS transistor; an inductor that is connected in parallel to (Continued)

the transconductance circuit; and a Gm control circuit that varies a transconductance of the MOS transistor.

5 Claims, 5 Drawing Sheets

(51) Int. Cl.
*H03B 5/12* (2006.01)
*H03B 5/08* (2006.01)
*H03F 3/45* (2006.01)
*H03L 7/10* (2006.01)

(52) U.S. Cl.
CPC ......... *H03B 5/1228* (2013.01); *H03B 5/1243* (2013.01); *H03B 5/1253* (2013.01); *H03B 5/1293* (2013.01); *H03F 3/45179* (2013.01); *H03H 11/04* (2013.01); *H03F 2203/45034* (2013.01); *H03F 2203/45634* (2013.01); *H03L 7/102* (2013.01)

(58) Field of Classification Search
CPC .. H03B 5/1293; H03B 5/1231; H03B 5/1243; H03B 5/08; H03B 5/1253; H03F 3/45179; H03F 2203/45034; H03F 2203/45634; H03L 7/102
USPC .................................. 331/177 V, 167, 117 FE
See application file for complete search history.

(56) References Cited

U.S. PATENT DOCUMENTS

2006/0238266 A1\* 10/2006 Harjani ................ H03B 5/1228
                                                                    331/167
2012/0040627 A1      2/2012 Fujiwara et al.

FOREIGN PATENT DOCUMENTS

| JP | 10-303701 A | 11/1998 |
|----|---|---|
| JP | 2003-506950 A | 2/2003 |
| JP | 2012-044274 A | 3/2012 |
| JP | 2014-075700 A | 4/2014 |
| WO | 2001/011773 A1 | 2/2001 |

\* cited by examiner

VARIABLE CAPACITANCE CIRCUIT, OSCILLATOR CIRCUIT, AND METHOD OF CONTROLLING VARIABLE CAPACITANCE CIRCUIT

CROSS REFERENCE TO RELATED APPLICATIONS

This application is a U.S. National Phase of International Patent Application No. PCT/JP2016/086142 filed on Dec. 6, 2016, which claims priority benefit of Japanese Patent Application No. JP 2016-009328 filed in the Japan Patent Office on Jan. 21, 2016. Each of the above-referenced applications is hereby incorporated herein by reference in its entirety.

TECHNICAL FIELD

The present technology relates to a variable capacitance circuit, an oscillator circuit, and a method of controlling a variable capacitance circuit.

BACKGROUND ART

A capacitor bank is conventionally known as a circuit that can change a capacitance value.

Patent Document 1 discloses an LC-VCO as an LC oscillator that varies an oscillation frequency using a capacitor bank. The LC-VCO includes an inductor, an offset capacitor, a varactor capacitor, a transistor for obtaining a negative resistance, and bias resistors RTOP and RBTM of the circuit, where the circuit changes the oscillation frequency by varying the capacitance value of the varactor capacitor included in the capacitor bank.

CITATION LIST

Patent Document

Patent Document 1: Japanese Patent Application Laid-Open No. 2012-44274

SUMMARY OF THE INVENTION

Problems to be Solved by the Invention

However, the use of the capacitor bank has disadvantages that the capacitance value becomes discontinuous and has an extremely narrow variable range. Thus, in order to obtain a wide variable range of the capacitance value while using the capacitor bank, a large number of capacitors with small capacitance values are to be connected in parallel and used while being switched by switches. However, if the large number of capacitors are connected in parallel to cause an increase in the number of switches, the parasitic capacitance is increased at the same time to cause a problem that an effective capacitance value is limited.

On the other hand, in a case where the capacitor bank is applied to an oscillator circuit, an oscillation frequency F of the oscillator circuit can be expressed by the following expression (1). In the following expression (1), L represents an inductance of the oscillator circuit, and C represents a capacitance value of the capacitor bank used for the oscillator circuit.

[Expression 1]

$$F = \frac{1}{2\pi\sqrt{LC}} \quad (1)$$

One can see in the above expression (1) that, in a case where the capacitance value C is increased due to the parasitic capacitance, the inductance L needs to be decreased in order to control the frequency to the desired oscillation frequency F. A decrease in the inductance L however causes the influence of the parasitic inductance on the inductance L to become manifest, thereby making it difficult to model the inductance L and control the inductance L.

Moreover, current consumption I of the capacitor bank is expressed by the following expressions (2) to (4). In the following expressions (2) to (4), Q represents a value expressing the sharpness of a resonance peak of a resonance circuit, ω represents an angular frequency, Ls represents an inductance of the inductor, $R_S$ represents a parasitic resistance component of the inductor, and $R_P$ represents a resistance component obtained by performing series-parallel conversion on $R_S$ (holds true only in a narrow band where the Q value is high).

[Expression 2]

$$Q = \frac{\omega L_S}{R_S} \quad (2)$$

[Expression 3]

$$R_P = \omega L_S Q \quad (3)$$

[Expression 4]

$$I \propto \frac{1}{R_P} \quad (4)$$

One can see from the above expressions (2) to (4) that a decrease in the value of L decreases Rp and thus increases the current consumption I. Thus, one can see that the oscillator circuit using the capacitor bank is essentially unable to achieve both a wide variable range of frequency and low current consumption.

The present technology has been made in view of the above problems, and an object of the present technology is to achieve at least one of: improving, as compared to a conventional case, continuity in a case where a capacitance value of a variable capacitance circuit is varied by electrical control without increasing a parasitic capacitance; and decreasing current consumption of an oscillator circuit using the variable oscillation circuit as compared to a conventional case.

Solutions to Problems

One aspect of the present technology is a variable capacitance circuit including: a transconductance circuit that includes a MOS transistor; an inductor that is connected in parallel to the transconductance circuit; and a Gm control circuit that varies a transconductance of the MOS transistor.

Moreover, another aspect of the present technology is an oscillator circuit including: a transconductance circuit that includes a MOS transistor; an inductor that is connected in parallel to the transconductance circuit; a Gm control circuit that varies a transconductance of the MOS transistor; and a negative resistance circuit that is connected in parallel to the transconductance circuit and the inductor.

Furthermore, another aspect of the present technology is a method of controlling a variable capacitance circuit, in which the variable capacitance circuit includes a transconductance circuit including a MOS transistor, an inductor connected in parallel to the transconductance circuit, and a current source MOS transistor passing a current between a drain and a source of the MOS transistor, and the method includes a Gm control step of adjusting a capacitance value of the variable capacitance circuit by varying a gate voltage input to a gate of the current source MOS transistor.

Note that the oscillator circuit and the variable capacitance circuit described above include various aspects such as being implemented while incorporated in another circuit and being implemented while incorporated in other listening. The present technology can also be realized as a control method which controls the capacitance value of the oscillator circuit or the variable capacitance circuit, a computer readable recording medium which records the control program described above, and the like.

Effects of the Invention

The present technology can achieve at least one of: improving the continuity in the case where the capacitance value of the variable capacitance circuit is varied as compared to a conventional case; and decreasing the current consumption of the oscillator circuit using the variable oscillation circuit as compared to a conventional case. Note that the effect described in the present specification is provided by way of example only and not by way of limitation, where there may be obtained an additional effect as well.

MODE FOR CARRYING OUT THE INVENTION

The present technology will be hereinafter described in the following order.
(A) First embodiment:
(B) Second embodiment:
(C) Third embodiment:
(D) Fourth embodiment:
(E) Other application examples:
(A) First Embodiment FIG. 1 is a diagram illustrating an example of a configuration of an active capacitance circuit 10.

The active capacitance circuit 10 in the figure includes a transconductance circuit 11 including a combination of a plurality of MOS transistors, a Gm control circuit 12 varying a transconductance (Gm) of each of the MOS transistors included in the transconductance circuit 11, and an inductor 13 connected in parallel to the transconductance circuit 11. A predetermined constant voltage (differential voltage between Vdd and Vss in FIG. 1) is applied between a source and a drain of each MOS transistor included in the transconductance circuit 11.

Figure 1:
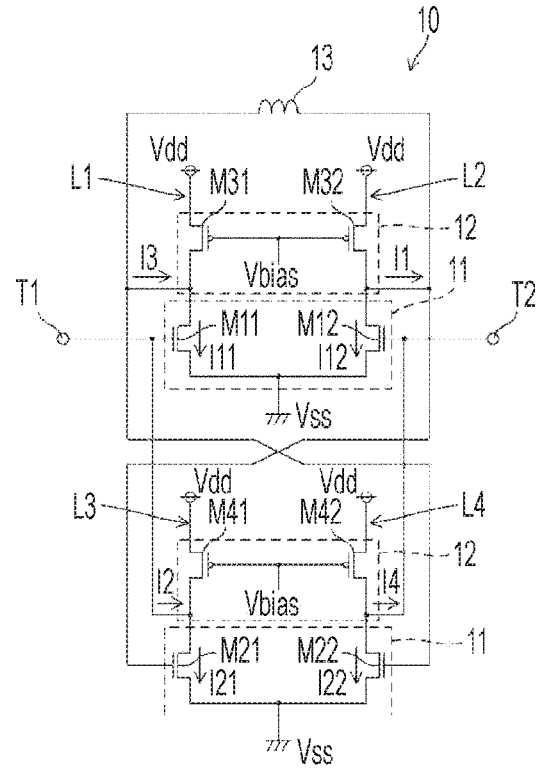
FIG. 1 is a diagram illustrating an example of a configuration of an active capacitance circuit according to a first embodiment.

The transconductance circuit 11 illustrated in FIG. 1 includes MOS transistors M11, M12, M21, and M22. The MOS transistors M11, M12, M21, and M22 are each an N-channel MOS transistor (NMOS).

Note that in the present embodiment, the MOS transistor M11 corresponds to a first MOS transistor, and the MOS transistor M12 corresponds to a third MOS transistor. The MOS transistor M21 corresponds to a fourth MOS transistor, and the MOS transistor M22 corresponds to a second MOS transistor The MOS transistor M11 has a gate connected to a terminal T1 as a first terminal, and a drain connected to a gate of the MOS transistor M22.

The MOS transistor M12 has a gate connected to a terminal T2 as a second terminal, and a drain connected to a gate of the MOS transistor M21.

The MOS transistor M21 has a drain connected to the terminal T1 and the gate connected to the drain of the MOS transistor M12.

The MOS transistor M22 has a drain connected to the terminal T2 and the gate connected to the drain of the MOS transistor M11.

The Gm control circuit 12 includes current source MOS transistors M31, M32, M41, and M42 provided to correspond to the MOS transistors M11, M12, M21, and M22, respectively. The current source MOS transistors M31, M32, M41, and M42 each function as a current source passing a current between the drain and the source of the corresponding MOS transistor. In the present embodiment, the current source MOS transistors M31, M32, M41, and M42 are each a P-channel MOS transistor (PMOS).

The current source MOS transistors are each disposed in series with a corresponding one of the MOS transistors on a line on which the corresponding one of the MOS transistors is disposed and which connects a constant voltage source Vdd and ground Vss.

More specifically, the current source MOS transistor M31 is disposed in series with the MOS transistor M11 on a first line L1 connecting the constant voltage source Vdd and the ground Vss, the current source MOS transistor M32 is disposed in series with the MOS transistor M12 on a second line L2 connecting the constant voltage source Vdd and the ground Vss, the current source MOS transistor M41 is disposed in series with the MOS transistor M21 on a third line L3 connecting the constant voltage source Vdd and the ground Vss, and the current source MOS transistor M42 is disposed in series with the MOS transistor M22 on a fourth line L4 connecting the constant voltage source Vdd and the ground Vss.

A current generated by a current DAC 50 is mirrored to the current source MOS transistors M31, M32, M41, and M42. The current DAC 50 can vary the current it generates according to a control signal input from the outside.

Figure 2:
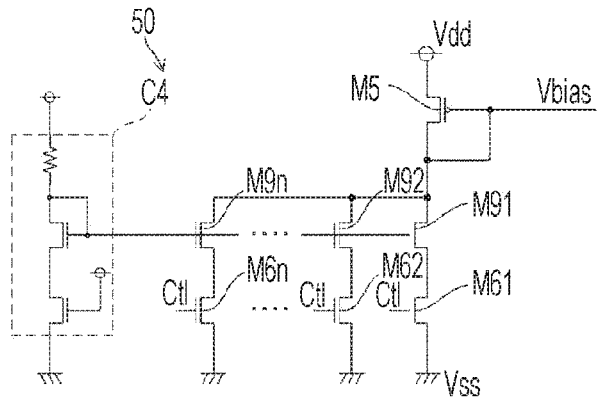
FIG. 2 is a diagram illustrating an example of a current DAC that generates a current mirror current.

FIG. 2 is a diagram illustrating an example of the current DAC 50 that generates the current according to the control signal. The current DAC 50 includes a current mirror transistor M5 which includes a PMOS which are MOS transistors having the same conductivity type as the current source MOS transistors M31, M32, M41, and M42, MOS transistors M91 to M9n which are MOS transistors having the same conductivity type as the MOS transistors M11, M12, M21, and M22, and switch transistors M61 to M6n for switching a value of current passing to the current mirror transistor M5 by switching the number of the MOS transistors M91 to M9n connected to the current mirror transistor M5. Note that a current passing through a resistor included in a bias circuit C4 corresponds to the current passing to the current mirror transistor M5, and a lower MOS transistor corresponds to a dummy circuit of the switch transistors M61 to M6n. The current passing through the current mirror transistor M5 is mirrored to the current source MOS transistors M31, M32, M41, and M42. A bias voltage is applied to gates of the MOS transistors M91 to M9n by the bias circuit C4 provided separately. As a result, the currents passing through the MOS transistors M11, M12, M21, and M22 included in the transconductance circuit 11 of the active capacitance circuit 10 are controlled to values corresponding to the number of the switch transistors M61 to M6n turned on, whereby the transconductance Gm of the transconductance circuit 11 is controlled.

The switch transistors M61 to M6n each include an NMOS. The current mirror transistor M5 and the switch transistors M61 to M6n are disposed on a line connecting the constant voltage source Vdd and the ground Vss. A gate and a source of the current mirror transistor M5 are connected to each other. A control signal Ctl (turn-on voltage) is input to gates of the switch transistors M61 to M6n from an external voltage control unit (not shown).

That is, the current passing through the current mirror transistor M5 is controlled to a value corresponding to the number of the switch transistors M61 to M6n turned on depending on which of the switch transistors M61 to M6n receives input of the control signal Ctl (turn-on voltage) at the gates thereof from the external voltage control unit.

The current source MOS transistors M31, M32, M41, and M42 pass a mirrored current Ids between the drain and the source of the corresponding MOS transistors M11, M12, M21, and M22.

More specifically, the current mirrored to the current source MOS transistor M31 becomes a current I11 passing between the drain and the source of the MOS transistor M11, the current mirrored to the current source MOS transistor M32 becomes a current I12 passing between the drain and the source of the MOS transistor M12, the current mirrored to the current source MOS transistor M41 becomes a current I21 passing between the drain and the source of the MOS transistor M21, and the current mirrored to the current source MOS transistor M42 becomes a current I22 passing between the drain and the source of the MOS transistor M22.

The values of the transconductance Gm of the MOS transistors M11, M12, M21, and M22 vary depending on the values of the currents I11, I12, I21, and I22 passing through the corresponding MOS transistors M11, M12, M21, and M22.

That is, the transconductance Gm of the MOS transistors M11, M12, M21, and M22 is controlled by controlling the currents I11, I12, I21, and I22. The transconductance Gm of the MOS transistors M11, M12, M21, and M22 can thus be controlled by controlling the current mirror current passing through the current source MOS transistors M31, M32, M41, and M42.

The inductor 13 is disposed between the drain of the MOS transistor M11 and the drain of the MOS transistor M22, where one terminal of the inductor is connected to a node at which the drain of the MOS transistor M11 and the gate of the MOS transistor M22 are connected while another terminal is connected to a node at which the drain of the MOS transistor M12 and the gate of the MOS transistor M21 are connected. Note that the area occupied by the inductor 13 formed in a semiconductor device can be reduced by using a 3D inductor with a three-dimensional structure as the inductor 13.

Figure 3:
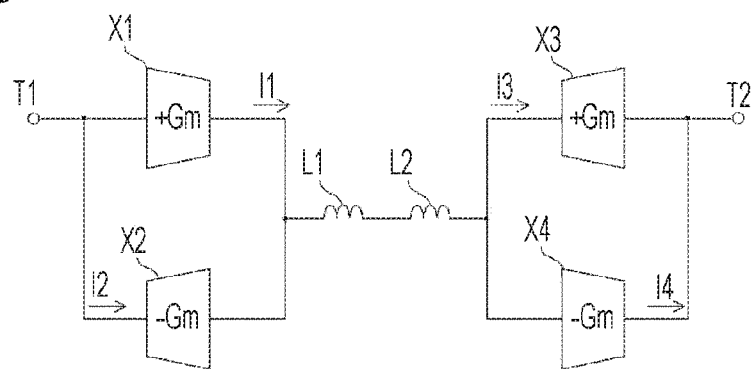
FIG. 3 is a diagram illustrating an equivalent circuit of the active capacitance circuit according to the first embodiment.

The active capacitance circuit 10 described above can be represented by an equivalent circuit in FIG. 3. That is, the active capacitance circuit 10 can be represented as an equivalent circuit where a circuit in which transconductance circuits X1 and X2 opposite in direction to each other are connected in parallel and a circuit in which transconductance circuits X3 and X4 opposite in direction to each other are connected in parallel are connected between the terminal T1 and the terminal T2 by two inductors connected in series.

The correspondence between the equivalent circuit illustrated in FIG. 3 and the active capacitance circuit 10 illustrated in FIG. 1 is as follows.

A gate of the transconductance circuit X1 (+Gm) in the equivalent circuit illustrated in FIG. 3 corresponds to the gate of the MOS transistor M11 illustrated in FIG. 1, and the output of the transconductance circuit X1 (+Gm) appears as a current I1 passing between the drain of the MOS transistor M12 and the inductor 13.

A gate of the transconductance circuit X2 (−Gm) in the equivalent circuit illustrated in FIG. 3 corresponds to the gate of the MOS transistor M21 illustrated in FIG. 1, and the output of the transconductance circuit X2 (−Gm) appears as a current I2 passing between the terminal T1 (the gate of the MOS transistor M11) and the drain of the MOS transistor M21.

A gate of the transconductance circuit X3 (+Gm) in the equivalent circuit illustrated in FIG. 3 corresponds to the gate of the MOS transistor M12 illustrated in FIG. 1, and the output of the transconductance circuit X3 (+Gm) appears as a current I3 passing between the drain of the MOS transistor M11 and the inductor 13.

A gate of the transconductance circuit X4 (−Gm) in the equivalent circuit illustrated in FIG. 3 corresponds to the gate of the MOS transistor M22 illustrated in FIG. 1, and the output of the transconductance circuit X4 (−Gm) appears as a current I4 passing between the terminal T2 (the gate of the MOS transistor M12) and the drain of the MOS transistor M22.

As described above, the circuit of FIG. 1 realizes the circuit configuration represented by the equivalent circuit illustrated in FIG. 3 and includes the plurality of N-channel MOS transistors of substantially the same size so that variations are less likely to occur.

Figure 4:
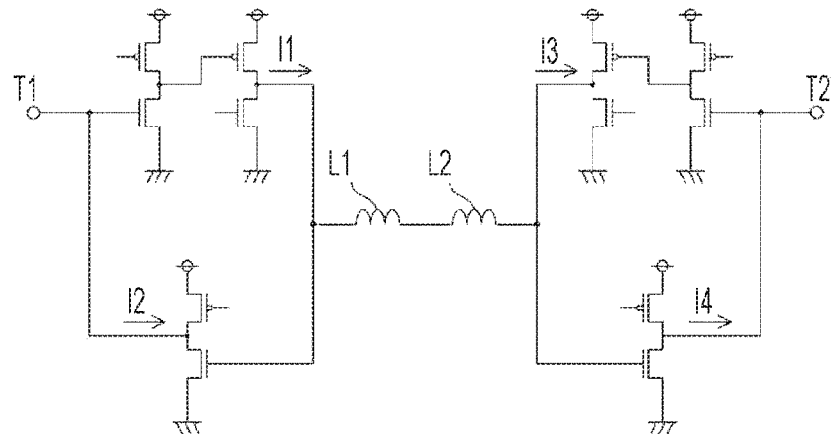
FIG. 4 is a diagram illustrating an example of another configuration of the active capacitance circuit.

The configuration of the active capacitance circuit 10 described above can of course be modified as appropriate within representation by the equivalent circuit illustrated in FIG. 3. For example, a transconductance circuit included in the active capacitance circuit may include a combination of a P-channel MOS transistor and an N-channel MOS transistor as illustrated in FIG. 4.

The capacitance value C of the active capacitance circuit 10 described above can be expressed by the following expression (5). In the following expression (5), L represents the inductance of the inductor 13, and Gm represents the transconductance of the transconductance circuit I1.

[Expression 5]

$$C = L \cdot Gm^2 \quad (5)$$

According to expression (5) above, one can see that the capacitance value C of the entire active capacitance circuit 10 changes with a change in the transconductance Gm of the transconductance circuit 11. One can also see that if the value of the current mirrored to the MOS transistors M11, M12, M21, and M22 included in the transconductance circuit 11 is changed continuously, the transconductance Gm of the transconductance circuit 11 is also changed continuously to be able to continuously change the capacitance value of the active capacitance circuit 10.

The active capacitance circuit 10 configured as described above can have extremely small design variations. Design variations of about ±20% occur with a typical metal capacitor, whereas the active capacitance circuit 10 does not use a metal capacitor and thus has no design variation caused by the metal capacitor. Moreover, the transconductance Gm of the transconductance circuit 11 in the active capacitance circuit 10 can be controlled to be constant by using the constant –Gm technique so that the number of design parameters can be reduced (the inductor is the only cause of variation). Furthermore, variations of the inductor component L are about ±3% so that the active capacitance circuit 10 as a whole has extremely small variations to be able to realize highly reliable capacitance designing. In addition, the active capacitance circuit 10 includes the combination of the inductor and the transconductance circuit 11 and controls the transconductance Gm of the transconductance circuit 11 to be constant using the constant-Gm technique, so that process variations, voltage fluctuations, and temperature changes can be extremely small.

Figure 5:
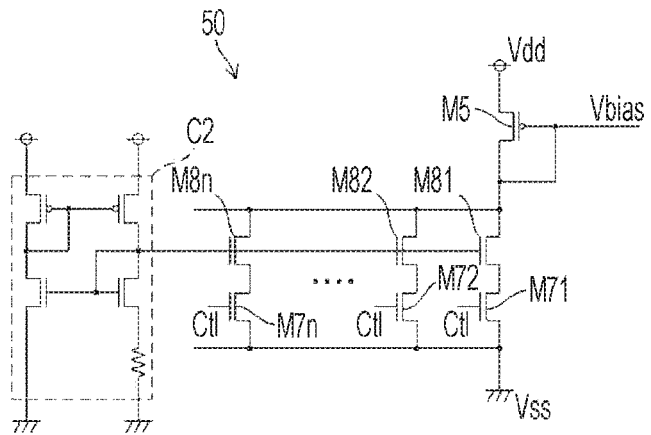
FIG. 5 is a diagram illustrating an example of the current DAC applying a constant-Gm technique.

FIG. 5 is a diagram illustrating an example of the current DAC 50 applying the constant-Gm technique. The current DAC 50 illustrated in the figure has a two-stage configuration of NMOS switch transistors M71 to M7n and transistors M81 to M8n with respect to the switch transistors M61 to M6n of the current DAC 50 illustrated in FIG. 2 above.

Then the switch transistors M71 to M7n are used in a way similar to the way the switch transistors M61 to M6n are used, and the transistors M81 to M8n are configured such that a bias voltage is applied to the gates thereof by a constant-Gm bias circuit C2 provided separately.

As a result, the transconductance Gm of the active capacitance circuit 10 is controlled to a constant value corresponding to the number of the switch transistors M71 to M7n turned on.

Figure 6:
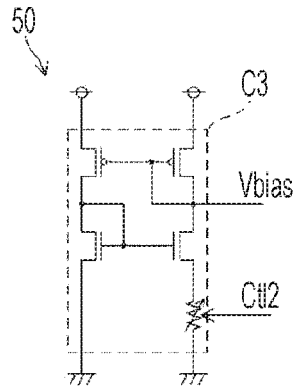
FIG. 6 is a diagram illustrating another example of the current DAC applying the constant-Gm technique.

Furthermore, FIG. 6 is a diagram illustrating another example of the current DAC 50 applying the constant-Gm technique. The current DAC 50 illustrated in the figure is configured to apply a bias voltage Vbias generated by a constant-Gm bias circuit C3 to the gates of the current source MOS transistors M31, M32, M41, and M42 of the active capacitance circuit 10. The resistance value of a variable resistor in the constant-Gm bias circuit C3 can be controlled by a control signal (Ctl2) from an external control unit (not shown), so that the value of Gm (constant Gm) of the active capacitance circuit 10 controlled by the constant –Gm bias circuit C3 can be adjusted by controlling the resistance value of the variable resistor.

The active capacitance circuit 10 can also operate at a low voltage of 1 V or less. That is, the configuration including one NMOS and one PMOS connected in series is the only essential circuit element to be disposed between the power supply and the ground, where the active capacitance circuit can be driven with a voltage more or less equal to a gate-source potential Vgs of the NMOS and a drain-source potential Vds of the PMOS with an error added thereto.

Moreover, in the case of a conventional capacitor bank, a wide variable range is obtained by switching the capacitance value by the switch so that the parasitic capacitance of the switch is increased at the same time to limit the effective capacitance value, as described above. On the other hand, the active capacitance circuit 10 electrically varies the capacitance to be able to obtain a wide variable range without increasing the parasitic capacitance. In addition, the electrically variable capacitance can be realized only with a transistor and a wiring layer so that there is no process dependency but high compatibility with digital technology.

(B) Second Embodiment

Figure 7:
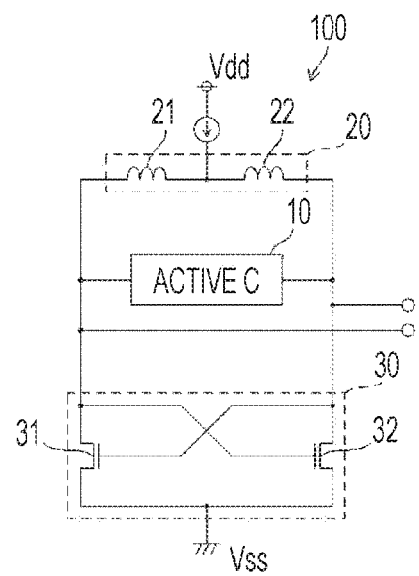
FIG. 7 is a diagram illustrating a basic configuration of an oscillator circuit according to a second embodiment.

FIG. 7 is a diagram illustrating a basic configuration of an oscillator circuit 100 according to the present embodiment.

The oscillator circuit 100 includes an LC oscillator having an inductor 20 and the active capacitance circuit 10 according to the first embodiment capable of variable control of the capacitance value, and a negative resistance circuit 30 is connected in parallel to each of the active capacitance circuit 10 and the inductor 20. Note that in a case where the oscillator circuit 100 is used in an PLL circuit illustrated in FIG. 10 as described later, a bias voltage Vbias output from a loop filter 303 is input as the bias voltage Vbias input to the active capacitance circuit 10.

The inductor 20 includes equivalent inductors 21 and 22 connected in series, and a node between the inductors 21 and 22 is connected to a constant voltage source Vdd. A constant current source may be interposed between the node and the constant voltage source Vdd, in which case the current passing through the oscillator circuit 100 is stabilized even in a case where the voltage of the constant voltage source Vdd fluctuates. This makes the transconductance Gm further less likely to fluctuate to be able to further reduce fluctuations in the oscillation frequency.

The negative resistance circuit 30 includes a pair of cross-coupled NMOSs 31 and 32. That is, a gate of the NMOS 31 is connected to a drain of the NMOS 32, and a drain of the NMOS 31 is connected to a gate of the NMOS 32. Sources of the NMOSs 31 and 32 are connected to a low potential voltage source Vss. The negative resistance circuit 30 functions as a negative resistance that cancels the attenuation due to a parasitic resistance component of the LC circuit including the active capacitance circuit 10 and the inductor 20 by signal amplification of the oscillator circuit 100.

The oscillator circuit 100 using such active capacitance circuit 10 can continuously vary the capacitance value of the active capacitance circuit 10 in addition to obtaining the advantages of the active capacitance circuit 10 itself described above. The oscillation frequency can thus be varied continuously as compared with a conventional oscillator circuit, and the parasitic capacitance can be kept low to result in an advantage that the current consumption is reduced as compared with the conventional oscillator circuit. The oscillator circuit also has an advantage described below.

Figure 8:
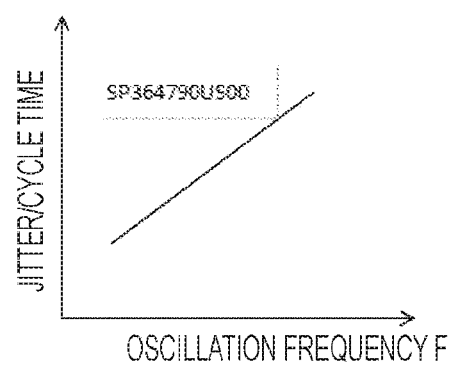
FIG. 8 is a graph illustrating a relationship between an oscillation frequency and a capacitance value of an active capacitance circuit included in the oscillator circuit according to the second embodiment.

FIG. 8 is a graph illustrating a relationship between the oscillation frequency of the active capacitance circuit 10 included in the oscillator circuit 100 and a "value obtained by dividing jitter by a cycle time of the oscillator circuit 100". An increase in the capacitance value of the active capacitance circuit 10 causes the oscillation frequency F of the oscillator circuit 100 to decrease.

Here, an active L circuit is conventionally known as a circuit configuration that can vary the oscillation frequency (for example, Japanese Laid-Open Patent Publication No. 2014-502820, etc.). The active L circuit is a variable inductor configured using a transconductance of a transistor and a capacitor. That is, a metal capacitor is used for the capacitor of an oscillator circuit using the active L circuit, where the metal capacitor typically has design variations of about ±20% as described above to thus cause a disadvantage that the active L circuit as a whole has larger variations.

Moreover, the oscillator circuit using the active L circuit adjusts the transconductance of the active L circuit to change the inductance and adjust the oscillation frequency. Here, in the oscillator circuit, the active L circuit is used while connected in parallel to a fixed L circuit with constant inductance. Thus, the active L circuit connected in the oscillator circuit causes the effective inductance of the oscillator circuit as a whole to decrease.

Therefore, even if the active L circuit is controlled to increase the inductance, the effective inductance value of the oscillator circuit as a whole is limited by the value of the fixed L circuit, so that the only effective control is to cause the inductance to be lower than that before the active L circuit is connected in the oscillator circuit, that is, to change the oscillation frequency to the high frequency side. At the same time, the noise (hereinafter referred to as Gm noise) generated due to the MOS transistor increases as the inductance increases so that, in the oscillator circuit in which the active L circuit is connected, the influence of jitter due to the Gm noise becomes manifest as the frequency increases. This results in a disadvantage that the oscillator circuit using the active L circuit can only be used in the low frequency range lower than or equal to the frequency at which the influence of jitter due to the Gm noise becomes manifest.

As for the oscillator circuit 100 according to the present embodiment as well, the Gm noise is certainly superimposed on an oscillation frequency signal. However, the capacitor is connected in parallel in the oscillator circuit 100 according to the present embodiment, so that the active capacitance circuit connected in the oscillator circuit causes the effective capacitance of the oscillator circuit as a whole to increase. Then as the capacitance value of the active capacitance circuit 10 is increased, the oscillation frequency F of the oscillator circuit 100 is decreased. At the same time, the noise (hereinafter referred to as the Gm noise) generated due to the MOS transistor increases as the capacitance is increased where, in the oscillator circuit in which the active capacitance circuit 10 is connected, the value obtained by dividing the jitter by the cycle time of the oscillator circuit tends to increase as the frequency decreases as illustrated in FIG. 8, whereby one can see that the circuit is less subjected to the influence of jitter due to the Gm noise in the low frequency range corresponding to a longer cycle time. That is, the oscillator circuit 100 according to the present embodiment has an advantage that the Gm noise is less likely to affect jitter.

Furthermore, in a case where the oscillator circuit 100 is oscillated at a high frequency, the circuit is oscillated with the parasitic capacitance and the inductor 13 with the active capacitance circuit 10 being turned off to thus make the Gm noise invisible.

Alternatively, the oscillator circuit 100 according to the present embodiment may be configured to connect a fixed capacitance circuit with a fixed value in parallel to the active capacitance circuit 10 and switchably connect the fixed capacitance circuit to the oscillator circuit 100 using a switch. That is, the capacitor included in the LC oscillator of the oscillator circuit 100 can be switched between the use of the circuit in which the active capacitance circuit 10 is connected in parallel to the fixed capacitance circuit and the use of the active capacitance circuit 10 alone. Even with this configuration, the Gm noise is invisible at the time the circuit oscillates with the fixed capacitance circuit and the inductor 13.

Figure 12:
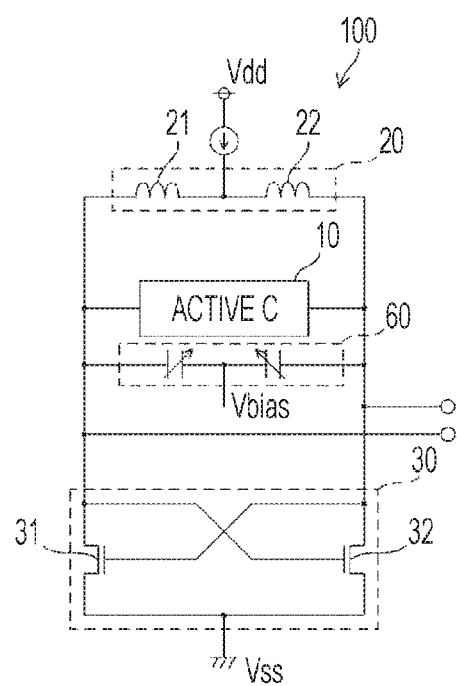
FIG. 12 is a diagram illustrating an example of another configuration of the oscillator circuit according to the second embodiment.

Alternatively, the oscillator circuit 100 according to the present embodiment may connect two varactor capacitors 60 in parallel to the active capacitance circuit 10 as illustrated in FIG. 12. In a case where the oscillator circuit 100 configured as illustrated in FIG. 12 is used for the PLL circuit, a bias voltage Vbias from the current DAC 50 or the like applying the constant-Gm technique as described in the first embodiment is input as the bias voltage Vbias to the active capacitance circuit 10, and a bias voltage Vbias output from the loop filter 303 is input to a node between the two varactor capacitors. Even with this configuration, the Gm noise can be made extremely small.

(C) Third Embodiment

Figure 9:
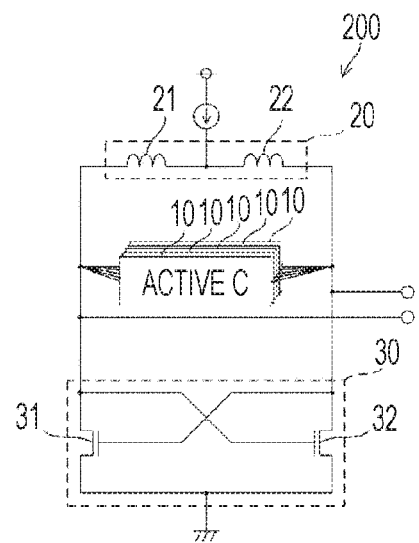
FIG. 9 is a diagram illustrating a configuration of an oscillator circuit according to a third embodiment.

FIG. 9 is a diagram illustrating a configuration of an oscillator circuit 200 according to the present embodiment. The oscillator circuit 200 illustrated in the figure has a configuration in which a plurality of active capacitance circuits 10 is connected in parallel in the oscillator circuit 100 according to the second embodiment. Note that the inductor 13 can be shared among the plurality of active capacitance circuits 10. In other words, an active capacitance circuit having a wider variable range of the capacitance value can be realized by connecting the plurality of active capacitance circuits 10 in parallel, in which case a plurality of transconductance circuits included in each of the active capacitance circuits 10 can be connected in parallel to the inductor 13. In the following description of the oscillator circuit 200, a configuration common to that of the oscillator circuit 100 will be assigned the same reference numeral as that assigned to such configuration in the oscillator circuit 100, and thus will not be described in detail.

The oscillator circuit 200 can obtain a very wide variable range of capacitance value by combining adjustment of the number of the active capacitance circuits 10 to be used and adjustment of the current value to be mirrored to each of the active capacitance circuits 10. That is, rough adjustment of capacitance is achieved by adjusting the number of the active capacitance circuits 10 used while connected to the oscillator circuit 200, and fine adjustment of capacitance is achieved by adjusting the value of current mirror current generated by the current DAC 50. Note that the adjustment of the number of the active capacitance circuits 10 and the adjustment of the current mirror current value are performed in accordance with a control signal input from an external control circuit (not shown).

(D) Fourth Embodiment

Figure 10:
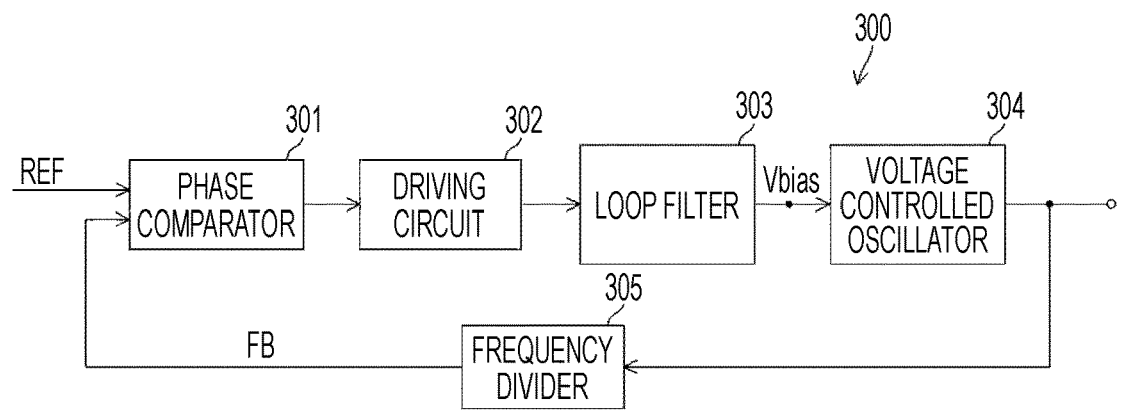
FIG. 10 is a block diagram illustrating a PLL circuit according to a fourth embodiment.

FIG. 10 is a block diagram illustrating a phase locked loop (PLL) circuit according to the present embodiment. Note that the PLL circuit is an example of a circuit configuration suitably using the oscillator circuit 100 or the oscillator circuit 200 described above, where the circuit configuration using the oscillator circuit 100 or the oscillator circuit 200 is not limited to such example.

A PLL circuit 300 includes a phase comparator 301, a driving circuit 302 with a charge pump, the loop filter 303, a voltage controlled oscillator 304, and a frequency divider 305. The oscillator circuit 100 or the oscillator circuit 200 described above is used as the voltage controlled oscillator 304.

The oscillator circuit 100 or the oscillator circuit 200 switches the transconductance Gm of the MOS transistor included in the active capacitance circuit 10 with the current value generated by the current DAC 50. The current DAC 50 is easily subjected to digital control and can thus be used as a digitally controlled oscillator that controls the frequency by digital control. The PLL circuit 300 according to the present embodiment can thus be configured as a so-called all digital phase locked loop.

(E) Other Application Examples

Figure 11A:
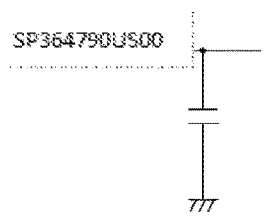
FIGS. 11A, 11B, and 11C are diagrams illustrating various application examples suitably using an active capacitance circuit.
Figure 11B:
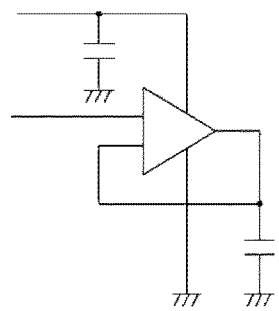
Figure 11C:
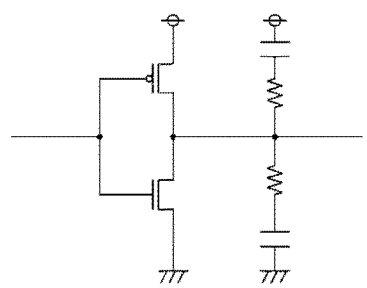

FIGS. 11A, 11B, and 11C illustrate various application examples suitably using the active capacitance circuit 10 described above. Note that these application examples are merely illustrated as examples, where it goes without saying that the active capacitance circuit introduced in the present specification can be used in various situations requiring switching and adjustment of the capacitance value.

FIG. 11A is an example in which the active capacitance circuit 10 is used as a capacitor of a low-pass filter. According to this low-pass filter, a wide cut-off frequency can be obtained by switching the capacitance value.

FIG. 11B is an example in which the active capacitance circuit 10 is used as a decoupling capacitor. A circuit such as a power supply has a trade-off between the area and noise performance, whereas the active capacitance circuit 10 described above is used to be able to realize a very high capacitance value with low noise and can thus be used as an on-chip capacitor.

FIG. 11C is an example in which the active capacitance circuit 10 is used as a variable phase compensation capacitor.

A circuit using an operational amplifier may require a phase compensation capacitor to ensure stability. At this time, the load condition varies depending on the situation so that guaranteeing the performance for all conditions is one factor that make an analog circuit difficult. A variable capacitance is realized electrically to be able to obtain a circuit that automatically finds the optimum stable point depending on the situation.

The active capacitance circuit 10 may be used for an on-die termination (ODT) circuit in which a termination resistor is incorporated in a chip. In a high-speed interface or the like, a termination circuit is inserted in a chip on the receiver side to prevent reflected waves in some cases. The termination circuit can be realized by a resistor alone but is realized by AC coupling in some cases because the configuration including only the resistor consumes a steady state current. At this time, impedance matching cannot be achieved if the capacitance value is not appropriate for the transmission frequency, whereby a reflected wave component is generated. An optimum capacitance value can be set by varying the capacitance with the present invention.

Note that the present technology is not limited to the aforementioned embodiments and variations but includes a configuration in which the configurations disclosed in the aforementioned embodiments and variations are mutually substituted or combined differently, a configuration in which the configurations disclosed in a known technology as well as the aforementioned embodiments and variations are mutually substituted or combined differently, and the like. Moreover, the technical scope of the present technology is not limited to the aforementioned embodiments but extends to matters described in the claims and equivalents thereof.

The present technology can also have the following configuration.

(1)

A variable capacitance circuit including:

a transconductance circuit that includes a MOS transistor;

an inductor that is connected in parallel to the transconductance circuit; and a Gm control circuit that varies a transconductance of the MOS transistor.

(2)

The variable capacitance circuit described in (1) above, in which the Gm control circuit includes: a current source MOS transistor that passes a current between a drain and a source of the MOS transistor; and a voltage control unit that variably generates a gate voltage input to a gate of the current source MOS transistor.

(3)

The variable capacitance circuit described in (2) above, in which the transconductance circuit includes: a first MOS transistor that has a gate connected to a first terminal; a second MOS transistor that has a gate connected to a drain of the first MOS transistor and a drain connected to a second terminal; a third MOS transistor that has a gate connected to the second terminal; and a fourth MOS transistor that has a gate connected to a drain of the third MOS transistor and a drain connected to the first terminal, the inductor is disposed between the first terminal and the second terminal, and the current source MOS transistor is provided for each of the first MOS transistor, the second MOS transistor, the third MOS transistor, and the fourth MOS transistor.

(4)

The variable capacitance circuit described in any one of (1) to (3) above, in which the inductor is an inductor having a three-dimensional structure.

(5)

The variable capacitance circuit described in any one of (1) to (4) above, in which a plurality of the transconductance circuits is connected in parallel to the inductor.

(6)

An oscillator circuit including:

a transconductance circuit that includes a MOS transistor;

an inductor that is connected in parallel to the transconductance circuit;

a Gm control circuit that varies a transconductance of the MOS transistor; and a negative resistance circuit that is connected in parallel to the transconductance circuit and the inductor.

(7)

A method of controlling a variable capacitance circuit, in which the variable capacitance circuit includes a transconductance circuit including a MOS transistor, an inductor connected in parallel to the transconductance circuit, and a current source MOS transistor passing a current between a drain and a source of the MOS transistor, and the method includes a Gm control step of adjusting a capacitance value of the variable capacitance circuit by varying a gate voltage input to a gate of the current source MOS transistor.

REFERENCE SIGNS LIST

10 Active capacitance circuit
11 Transconductance circuit
12 Gm control circuit
13 Inductor
50 Current DAC
Gm Transconductance
I11 Current
I12 Current
I21 Current
I22 Current
Ids Current
L1 First line
L2 Second line
L3 Third line
L4 Fourth line
M11 MOS transistor
M12 MOS transistor
M21 MOS transistor
M22 MOS transistor
M31 Current source MOS transistor
M32 Current source MOS transistor
M41 Current source MOS transistor
M42 Current source MOS transistor
M5 PMOS
M61 to M6$n$ NMOS
T1 Terminal
T2 Terminal
Vdd Constant voltage source
Vss Ground
X1 Circuit
X2 Circuit

The invention claimed is:

1. A variable capacitance circuit, comprising:
   a first terminal;
   a second terminal;
   a transconductance circuit that includes a plurality of Metal Oxide Semiconductor (MOS) transistors, wherein the plurality of MOS transistors comprises:
     a first MOS transistor that includes a gate connected to the first terminal;
     a second MOS transistor that includes:
       a gate connected to a drain of the first MOS transistor; and
       a drain connected to the second terminal;
     a third MOS transistor that includes a gate connected to the second terminal; and
     a fourth MOS transistor that includes:
       a gate connected to a drain of the third MOS transistor; and
       a drain connected to the first terminal of the variable capacitance circuit;
   an inductor connected in parallel to the transconductance circuit, wherein the inductor is between the first terminal and the second terminal; and
   a Gm control circuit configured to vary a transconductance of the plurality of MOS transistors, wherein the Gm control circuit comprises:
     a current source MOS transistor provided for each of the first MOS transistor, the second MOS transistor, the third MOS transistor, and the fourth MOS transistor, wherein the current source MOS transistor is configured to pass a current between a drain and a source of a corresponding MOS transistor of the plurality of MOS transistors; and
     a voltage control unit configured to variably generate a gate voltage input to a gate of the current source MOS transistor.

2. The variable capacitance circuit according to claim 1, wherein the inductor has a three-dimensional structure.

3. The variable capacitance circuit according to claim 1, further comprising a plurality of transconductance circuits connected in parallel to the inductor.

4. An oscillator circuit, comprising:
   a first terminal;
   a second terminal;
   a transconductance circuit that includes a plurality of Metal Oxide Semiconductor (MOS) transistors, wherein the plurality of MOS transistors comprises:
     a first MOS transistor that includes a gate connected to the first terminal;
     a second MOS transistor that includes:
       a gate connected to a drain of the first MOS transistor; and
       a drain connected to the second terminal;
     a third MOS transistor that includes a gate connected to the second terminal; and
     a fourth MOS transistor that includes:
       a gate connected to a drain of the third MOS transistor; and
       a drain connected to the first terminal;
   an inductor connected in parallel to the transconductance circuit, wherein the inductor is between the first terminal and the second terminal;
   a Gm control circuit configured to vary a transconductance of the plurality of MOS transistors, wherein the Gm control circuit comprises:
     a current source MOS transistor provided for each of the first MOS transistor, the second MOS transistor, the third MOS transistor, and the fourth MOS transistor, wherein the current source MOS transistor is configured to pass a current between a drain and a source of a corresponding MOS transistor of the plurality of MOS transistors; and
     a voltage control unit configured to generate a gate voltage input to a gate of the current source MOS transistor; and
   a negative resistance circuit connected in parallel to the transconductance circuit and the inductor.

5. A method of controlling a variable capacitance circuit, the method comprising:
   adjusting a capacitance value of the variable capacitance circuit based on a variation of a gate voltage input to a gate of a current source Metal Oxide Semiconductor (MOS) transistor of a Gm control circuit of the variable capacitance circuit, wherein
   the current source MOS transistor is provided for each of a first MOS transistor, a second MOS transistor, a third MOS transistor, and a fourth MOS transistor of a transconductance circuit of the variable capacitance circuit,
   the first MOS transistor includes a gate connected to a first terminal of the variable capacitance circuit,
   the second MOS transistor includes:
     a gate connected to a drain of the first MOS transistor; and
     a drain connected to a second terminal of the variable capacitance circuit,
   the third MOS transistor includes a gate connected to the second terminal, the fourth MOS transistor includes:
a gate connected to a drain of the third MOS transistor; and
a drain connected to the first terminal, an inductor is connected in parallel to the transconductance circuit, the inductor is between the first terminal and the second terminal, the current source MOS transistor is configured to pass a current between a drain and a source of a corresponding MOS transistor, and the Gm control circuit includes a voltage control unit configured to generate a gate voltage input to a gate of the current source MOS transistor.

\* \* \* \* \*